United States Patent
Ishii

(10) Patent No.: US 6,952,566 B2
(45) Date of Patent: Oct. 4, 2005

(54) TRANSMISSION CIRCUIT AND UNNECESSARY RADIANT WAVE SUPPRESSION METHOD

(75) Inventor: Katsuhiro Ishii, Tokyo (JP)

(73) Assignee: NEC Corporation, Tokyo (JP)

( * ) Notice: Subject to any disclaimer, the term of this patent is extended or adjusted under 35 U.S.C. 154(b) by 760 days.

(21) Appl. No.: 09/938,586

(22) Filed: Aug. 27, 2001

(65) Prior Publication Data

US 2002/0032012 A1 Mar. 14, 2002

(30) Foreign Application Priority Data

Aug. 28, 2000 (JP) ........................................ 2000-256790

(51) Int. Cl.$^7$ ............................................... H04B 1/04
(52) U.S. Cl. .................... 455/114.1; 455/103; 455/295; 455/296; 455/552.1
(58) Field of Search ........................... 455/114.1, 114.2, 455/114.3, 295, 296, 103, 552.1, 553.1

(56) References Cited

U.S. PATENT DOCUMENTS

| | | | | |
|---|---|---|---|---|
| 4,811,422 A | * | 3/1989 | Kahn ....................... | 455/114.1 |
| 6,366,788 B1 | * | 4/2002 | Fujioka et al. ........... | 455/553.1 |
| 6,400,963 B1 | * | 6/2002 | Glockler et al. ......... | 455/553.1 |

FOREIGN PATENT DOCUMENTS

| | | |
|---|---|---|
| JP | 50-32765 | 10/1975 |
| JP | 2-285725 A | 11/1990 |
| JP | 11-41131 A | 2/1999 |
| JP | 11-355056 A | 12/1999 |
| JP | 11-355056 | * 12/1999 |
| JP | 11-355155 A | 12/1999 |
| WO | WO 00/03490 A1 | 1/2000 |

* cited by examiner

*Primary Examiner*—Fan Tsang
*Assistant Examiner*—Simon Sing
(74) *Attorney, Agent, or Firm*—Sughrue Mion, PLLC

(57) ABSTRACT

A transmission circuit includes first and second amplifiers, a bandpass filter, a phase adjuster, and a signal combiner. The first and second amplifiers independently amplify input signals in different transmission frequency bands. The first amplifier in the ON state produces an unnecessary radiant wave in a frequency band substantially coinciding with the transmission frequency band of the second amplifier in the OFF state. The bandpass filter extracts a component in the same frequency band as that of an unnecessary radiant wave leaking out from the second amplifier during operation of the first amplifier. A phase adjuster adjusts the phase of an output signal from the bandpass filter such that the phase of the output signal from the bandpass filter becomes opposite to that of an unnecessary radiant wave in an output signal from the first amplifier. The signal combiner combines an output signal from the phase adjuster with the output signal from the first amplifier.

5 Claims, 1 Drawing Sheet

TRANSMISSION CIRCUIT AND UNNECESSARY RADIANT WAVE SUPPRESSION METHOD

BACKGROUND OF THE INVENTION

The present invention relates to a transmission circuit having a plurality of amplifiers having different transmission frequency bands and, more particularly, to a transmission circuit and unnecessary radiant wave suppression method which can suppress unnecessary radiant waves produced by amplifiers during operation.

Currently, in the field of mobile communications, with the widespread use of terminals, the traffic has considerably increased, and a plurality of systems that greatly differ in their frequency bands exist. In order to improve the convenience to users, demands have arisen for a terminal that can singly receive services from these systems. Under the circumstances, mounting a common circuit having some of a plurality of usable frequencies is preferable to mounting a plurality of circuits that greatly differ in their usable frequencies in terms of cost and mount area. This is obvious because a reduction in terminal size is also a demand on the market.

To meet the above demand on the market, a mobile communication terminal has been proposed, on which a transmission circuit serving as a power amplifier circuit having a plurality of transmission frequency bands is mounted. Such a transmission circuit has, in one semiconductor die, a plurality of circuits optimized in the respective transmission frequency bands. For this reason, when a circuit in a certain transmission frequency band is transmitting a signal, another circuit in a different transmission frequency band may be affected by the circuit in use.

When a given transmission frequency band is nearly twice another transmission frequency band, in particular, the second harmonic produced by the amplifier in the lower frequency band coincides with a desired frequency in the amplifier in the higher frequency band. It is therefore essentially impossible to suppress this second harmonic in the amplifier in the higher frequency band. For this reason, when the amplifier in the lower frequency band is operating and the amplifier in the higher frequency band is not operating, unnecessary radiant waves are emitted, in a slight amount but at a level that cannot be neglected, from the output circuit of the amplifier in the higher frequency band which should not be operating, from the viewpoint of the overall mobile communication terminal.

To suppress such unnecessary radiant waves, a dual band transmission circuit like the one shown in FIG. 2 has been proposed. Referring to FIG. 2, reference numeral 11 denotes an amplifier for GSM (Global System for Mobile Communication )900 (890 to 915 MHz); 12, an amplifier for DCS(Digital Cellular System)1800 (1710 to 1785 MHz); 13, a low-pass filter (LPF) for GSM900; 14, an LPF for DCS1800; 15, a diplexer; and 16, an antenna. In the circuit shown in FIG. 2, the LPFs 13 and 14 are respectively connected to the output stages of the amplifiers 11 and 12 to suppress unnecessary radiant waves such as harmonic components.

In a conventional dual band transmission circuit, however, since the LPFs are directly connected to the output terminals of the respective amplifiers, in-band ripples are produced and attenuation of signals occur in a transmission frequency band. In addition, the load characteristics of amplifiers do not stabilize. Although FIG. 2 shows the dual band transmission circuit having amplifiers in two transmission frequency bands, similar problems arise in a transmission circuit having amplifiers in three or more transmission frequency bands as well.

SUMMARY OF THE INVENTION

It is an object of the present invention to provide a transmission circuit which can suppress unnecessary radiant waves without connecting low-pass filters to the output terminals of the respective amplifiers.

In order to achieve the above object, according to the present invention, there is provided a transmission circuit comprising first and second amplification means for independently amplifying input signals in different transmission frequency bands, the first amplification means in an ON state producing an unnecessary radiant wave in a frequency band substantially coinciding with a transmission frequency band of the second amplification means in an OFF state, first filter means for extracting a component in the same frequency band as that of an unnecessary radiant wave leaking out from the second amplification means during operation of the first amplification means, phase adjusting means for adjusting a phase of an output signal from the first filter means such that the phase of the output signal from the first filter means becomes opposite to that of an unnecessary radiant wave in an output signal from the first amplification means, and signal combining means for combining an output signal from the phase adjusting means with the output signal from the first amplification means.

DESCRIPTION OF THE PREFERRED EMBODIMENT

The present invention will be described in detail below with reference to the accompanying drawing.

Figure 1:
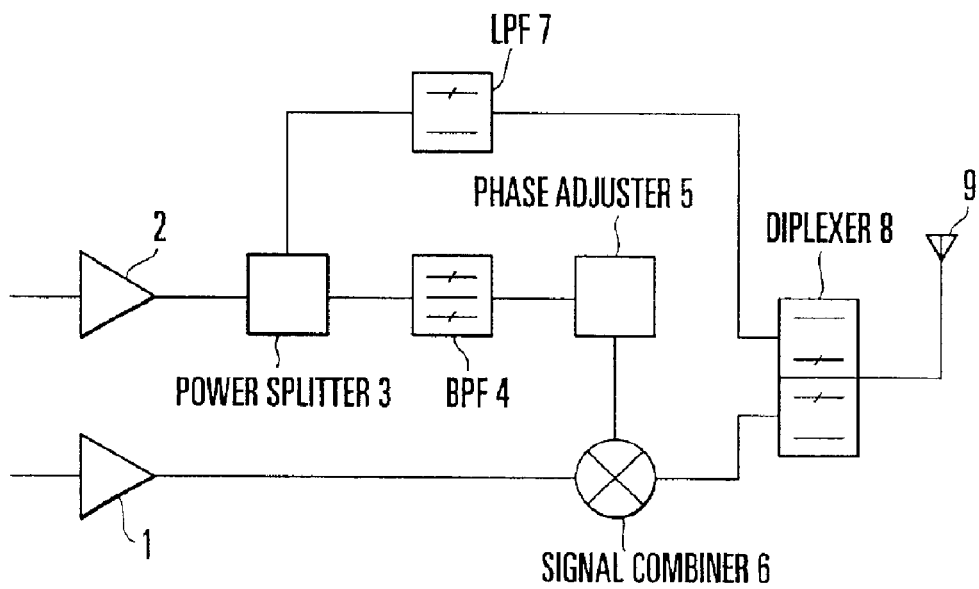
FIG. 1 is a block diagram showing the arrangement of a dual band transmission circuit according to an embodiment of the present invention.

FIG. 1 shows a dual band transmission circuit according to an embodiment of the present invention. The dual band transmission circuit shown in FIG. 1 is comprised of amplifiers 1 and 2 for amplifying input signals, a power splitter (demultiplexing) 3 for receiving an output from the amplifier 2, a bandpass filter (BPF) 4 for receiving an output from the power splitter 3, a phase adjuster 5 for receiving an output from the BPF 4, a signal combiner 6 for receiving outputs from the amplifier 1 and phase adjuster 5, an LPF 7 for receiving an output from the power splitter 3, a diplexer (output means) 8 for receiving outputs from the signal combiner 6 and LPF 7, and an antenna 9 for receiving an output from the diplexer 8. In this arrangement, the signal input to the amplifier 1 or 2 is amplified and transmitted from the antenna 9.

The amplifiers 1 and 2 respectively amplify input signals having optimized desired frequencies and output the amplified signals. The desired frequency band of the amplifier 2 is set to be almost twice that of the amplifier 1. The frequency band of GSM900 is 890 to 915 MHz, and the frequency band of DCS1800 is 1,710 to 1,785 MHz. In this case, therefore, the amplifiers 1 and 2 are used for GSM900 and DCS1800, respectively.

The power splitter 3 splits an output signal from the amplifier 2 at a predetermined arbitrary power ratio and outputs the resultant signals to the BPF 4 and LPF 7. The BPF 4 allows a signal in a predetermined frequency band to pass therethrough and attenuates other signals. The phase adjuster 5 arbitrarily shifts only the phase of the input signal output from the BPF 4 while keeping its frequency.

The signal combiner 6 combines the power amplitude of the output signal from the amplifier 1 with that of the output signal from the phase adjuster 5, and outputs the resultant signal. If, therefore, signals having the same amplitude and opposite phases are combined, they are canceled out. The LPF 7 allows signals, of output signals from the power splitter 3, which have frequencies equal to or lower than a specific frequency to pass therethrough and attenuates signals having frequencies higher than the specific frequency.

The diplexer 8 allows signals, of output signals from the signal combiner 6 and LPF 7, which are in the desired frequency bands of the amplifiers 1 and 2 to pass therethrough and attenuates signal components in frequency bands other than the desired frequency bands.

The operation of the dual band transmission circuit having the above arrangement will be described next.

A case where the amplifier 1 is used to amplify a signal will be described first. An input desired signal wave in the GSM900 band is amplified by the amplifier 1 and output to the signal combiner 6. At the same time, harmonic components are also produced. Although the amplifier 2 is not operating, since the output circuit of the amplifier 2 is optimized in a range near the frequency of the second harmonic produced by the amplifier 1, it looks like unnecessary radiant waves were also produced by the amplifier 2.

The unnecessary radiant waves leaking out from the output circuit of the amplifier 2 are input to the BPF 4 through the power splitter 3. The characteristics of the BPF 4 are set to extract components in the same frequency band as that of the second harmonic of the desired frequency of the amplifier 1 and attenuate other frequency components. Of the signals leaking out from the amplifier 2, therefore, signals other than the unnecessary radiant waves are attenuated by the BPF 4.

An output signal from the BPF 4 is input to the signal combiner 6 through the phase adjuster 5. The phase adjuster 5 adjusts the phase of the output signal from the BPF 4 such that the phase of the output signal from the BPF 4 becomes completely opposite to that phase of the second harmonic component in the output signal from the amplifier 1 in the signal combiner 6. The phase-adjusted output signal is supplied to the signal combiner 6.

The signal combiner 6 combines the power amplitude of the output signal from the amplifier 1 with that of the output signal from the phase adjuster 5, and outputs the resultant signal. Since the second harmonic component in the output signal from the amplifier 1 and the output signal from the phase adjuster 5 are in opposite phase as described above, these components cancel out each other when they are combined by the signal combiner 6. As a consequence, the components are attenuated and output. The output signal from the signal combiner 6 is emitted from the antenna 9 through the diplexer 8.

Figure 2:
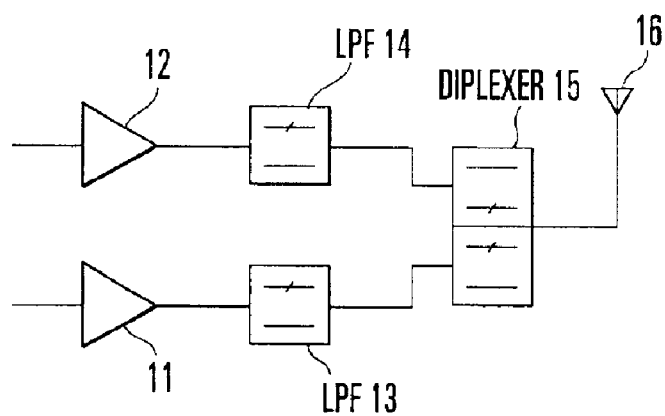
FIG. 2 is a block diagram showing the arrangement of a conventional dual band transmission circuit.

A case where the amplifier 2 is used to amplify an input signal will be described next. An input desired signal wave in the DCS1800 band is amplified by the amplifier 2 and input to the LPF 7 through the power splitter 3. The LPF 7 allows a signal in the DCS1800 band to pass therethrough and attenuates signals having frequencies higher than this band. The desired signal wave in the DCS1800 band which has passed through the LPF 7 is emitted from the antenna 9 through the diplexer 8. In this manner, unnecessary radiant waves can be suppressed as in the conventional circuit shown in FIG. 2.

According to this embodiment, in a transmission circuit having a plurality of transmission frequency bands, unnecessary harmonic components can be suppressed by combining them upon changing the phases. This transmission circuit can decrease the output levels of unnecessary harmonics while minimizing the attenuation of the output level of a desired wave and the occurrence of in-band ripples. Although the phase adjuster 5 and signal combiner 6 may consume a certain amount of current, this amount is trivial as compared with the current consumption of the amplifiers 1 and 2 in a practical arrangement.

In the above embodiment, the expressions "GSM900" and "DCS1800" indicate frequency bands near 900 MHz and 1,800 MHz, respectively, and impose no limitations on the system according to the present invention. Likewise, in the above embodiment, the amplifier 1 is optimized in the GSM900 band. This is because it is technically most difficult to suppress the second harmonic of GSM owing to the specifications of GSM and general amplifier characteristics. However, the application of this technique is not limited to GSM900.

The above embodiment has exemplified the dual band transmission circuit having the two amplifiers 1 and 2 with different transmission frequency bands. However, the present invention can be applied to a transmission circuit having three or more amplifiers with different transmission frequency bands. In a circuit having three or more amplifiers, if the frequency band of unnecessary radiant waves produced by the first amplifier in the ON state almost coincides with the transmission frequency band of the second amplifier in the OFF state, the unnecessary radiant waves produced by the first amplifier can be suppressed by the arrangement shown in FIG. 1. Therefore, an arrangement having the same relationship as that shown in FIG. 1 may be provided for each pair of amplifiers.

In the above embodiment, the second harmonic of the unnecessary radiant waves produced by the amplifier 1 is suppressed. Theoretically, harmonics other than the second harmonic can be suppressed as long as the frequency band of the unnecessary radiant waves produced by the first amplifier in the ON state almost coincides with the transmission frequency band of the second amplifier in the OFF state. In the above embodiment, although a power amplifier produced by, for example, a GaAs process is assumed to be used, the semiconductor manufacturing process and the like are not specifically limited.

As the phase adjuster 5 in this embodiment, for example, a delay line is assumed. However, this may be formed by an active element or the like. As the signal combiner 6, for example, a mixer is assumed. This is not limited to an active circuit or passive circuit either. The antenna 9 has the property of sending out power in the air. The present invention can use either a wire antenna or a radio antenna.

As has been described above, according to the present invention, the unnecessary radiant waves produced by an amplifier in the ON state can be suppressed in the process of signal combining performed by the signal combiner. As a consequence, there is no need to connect a low-pass filter to the output terminal of the amplifier. This makes it possible to suppress attenuation of a desired transmission wave and the occurrence of ripples in the transmission frequency band. In addition, an improvement in efficiency can be expected owing to the stable load characteristics of the amplifier itself.

Furthermore, decreases in the levels of unnecessary radiant waves can be expected to an extent equal to or better than the prior art.

What is claimed is:

1. A transmission circuit characterized by comprising:

first and second amplification means (1, 2) for independently amplifying input signals in different transmission frequency bands, said first amplification means (1) in an ON state producing an unnecessary radiant wave in a frequency band substantially coinciding with a transmission frequency band of said second amplification means (2) in an OFF state;

first filter means (4) for extracting a component in the same frequency band as that of an unnecessary radiant wave leaking out from said second amplification means during operation of said first amplification means;

phase adjusting means (5) for adjusting a phase of an output signal from said first filter means such that the phase of the output signal from said first filter means becomes opposite to that of an unnecessary radiant wave in an output signal from said first amplification means; and signal combining means (6) for combining an output signal from said phase adjusting means with the output signal from said first amplification means.

2. A circuit according to claim 1, further demultiplexing means for demultiplexing the output signal from said second amplification means to output a first signal to be supplied to said first filter means and a second signal;

second filter means for extracting a desired signal from the second signal output from said demultiplexing means; and output means for selectively outputting one of the output signals from said signal combining means and said second filter means.

3. A circuit according to claim 1, wherein said first filter means comprises a bandpass filter, and second filter means comprises a low-pass filter.

4. An unnecessary radiant wave suppression method comprising the steps of:

setting transmission frequency bands for a first amplifier and a second amplifier such that a frequency band of an unnecessary radiant wave produced by the first amplifier in an ON state substantially coincides with a transmission frequency band of the second amplifier in an OFF state;

extracting a component in the same frequency band as that of an unnecessary radiant wave leaking out from the second amplifier during operation of the first amplifier;

adjusting a phase of the extracted signal component such that the phase becomes opposite to a phase of an unnecessary radiant wave in an output signal from the first amplifier; and combining the phase-adjusted signal with the output signal from the first amplifier.

5. A method according to claim 4, further comprising the step of extracting a desired signal wave from a demultiplexed output signal from the second amplifier during operation of the second amplifier.

* * * * *